(12) United States Patent
Cheng et al.

(10) Patent No.: US 8,697,522 B2
(45) Date of Patent: Apr. 15, 2014

(54) BULK FINFET WITH UNIFORM HEIGHT AND BOTTOM ISOLATION

(75) Inventors: Kangguo Cheng, Albany, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 13/176,456

(22) Filed: Jul. 5, 2011

(65) Prior Publication Data

US 2013/0009246 A1    Jan. 10, 2013

(51) Int. Cl.
*H01L 21/336* (2006.01)

(52) U.S. Cl.
USPC ........... 438/283; 438/198; 438/478; 257/350; 257/E27.06

(58) Field of Classification Search
USPC .......... 257/341, 350, 390, E21.623, E21.637, 257/347, E21.04, E61.637, E27.06, 257/E21.219, E21.09, E29.273; 438/478, 438/694, 696, 740, 28, 197
See application file for complete search history.

(56) References Cited

U.S. PATENT DOCUMENTS

| | | | |
|---|---|---|---|
| 5,960,318 A * | 9/1999 | Peschke et al. | 438/637 |
| 6,580,137 B2 | 6/2003 | Parke | |
| 6,642,090 B1 * | 11/2003 | Fried et al. | 438/164 |
| 6,882,025 B2 | 4/2005 | Yeo et al. | |
| 6,919,647 B2 | 7/2005 | Hackler, Sr. et al. | |
| 7,026,196 B2 | 4/2006 | Hou et al. | |
| 7,052,964 B2 | 5/2006 | Yeo et al. | |
| 7,056,781 B2 | 6/2006 | Yoon et al. | |
| 7,074,623 B2 | 7/2006 | Lochtefeld et al. | |
| 7,101,763 B1 | 9/2006 | Anderson et al. | |
| 7,109,516 B2 | 9/2006 | Langdo et al. | |
| 7,247,570 B2 | 7/2007 | Thomas | |
| 7,285,812 B2 | 10/2007 | Tang et al. | |
| 7,829,466 B2 * | 11/2010 | Johnson et al. | 438/703 |
| 2005/0224875 A1 * | 10/2005 | Anderson et al. | 257/347 |
| 2006/0289909 A1 * | 12/2006 | Gluschenkov et al. | 257/288 |
| 2009/0078997 A1 * | 3/2009 | Greene et al. | 257/347 |
| 2010/0248454 A1 * | 9/2010 | Maszara et al. | 438/478 |
| 2010/0323481 A1 * | 12/2010 | Juengling | 438/157 |

* cited by examiner

*Primary Examiner* — Cuong Q Nguyen
*Assistant Examiner* — Yosef Gebreyesus
(74) *Attorney, Agent, or Firm* — Novak Druce Connolly Bove + Quigg LLP; Louis J. Percello, Esq.

(57) ABSTRACT

A fin Field Effect Transistor (finFET), an array of finFETs, and methods of production thereof. The finFETs are provided on an insulating region, which may optionally contain dopants. Further, the finFETs are optionally capped with a pad. The finFETs provided in an array are of uniform height.

16 Claims, 10 Drawing Sheets

BULK FINFET WITH UNIFORM HEIGHT AND BOTTOM ISOLATION

FIELD OF THE DISCLOSURE

The present disclosure relates to methods of forming and substrates comprising fin Field Effect Transistors (finFETs) on semiconductor substrates. In particular, the present disclosure relates to finFETs having uniform fin height and isolation at the bottom of the fin.

BACKGROUND

In recent years, finFETs have established themselves as viable alternatives to traditional Field Effect Transistors (FETs) in semiconducting devices. A finFET is a double gate FET in which the transistor channel is a semiconducting "fin." The gate dielectric and gate are positioned around the fin such that current flows down the channel on the two sides of the fin.

However, the finFETs of the related art on a bulk semiconductor substrate (referred to as "bulk finFET" hereinafter) have the disadvantage that the channel region, i.e., the fin, is not electrically isolated from the rest of substrate. As a result, source/drain leakage of currents due to the channel effect may occur.

Additionally, bulk finFET arrays of the related art have to date not been provided with a uniform height. In particular, the finFETs in arrays have varying heights because varying amounts of substrate are removed between adjacent finFETs within the same array at different points on the array due to variations in local etching rates. Moreover, even between two adjacent finFETS, more substrate may be etched at a position close to the first finFET and less at a position close to the second finFET, or vice versa.

SUMMARY OF THE DISCLOSURE

Disclosed herein are methods of forming finFETs and substrates comprising finFETs with uniform fin height and isolation at the bottom of the fin. In particular, semiconductor structures comprising a substrate and a fin Field Effect Transistor (finFET) on the substrate are disclosed, wherein the finFET is insulated from the substrate by an insulating region, and wherein the insulating region comprises a dopant selected from the group consisting of aluminum, arsenic, boron, gallium, indium, phosphorous, antimony, sulfur, selenium, germanium, carbon, argon, xenon, and fluorine, or a combination thereof.

Further disclosed is a semiconductor structure comprising a plurality of fin Field Effect Transistors (finFETs) on a substrate, wherein the plurality of finFETs are of a uniform height, and wherein the plurality of finFETs is insulated from the substrate by an insulating region, and wherein the insulating region comprises a dopant selected from the group consisting of aluminum, arsenic, boron, gallium, indium, phosphorous, antimony, sulfur, selenium, germanium, carbon, argon, xenon, and fluorine, or a combination thereof.

Moreover, a method of forming a fin Field Effect Transistor (finFET) on a substrate is disclosed, wherein the method comprises providing a substrate, forming an etch stop layer within the substrate, etching a surface of the substrate up to or into the etch stop layer to form a fin, and converting the etch stop layer into an insulating layer.

In addition, a method of forming a fin Field Effect Transistor (finFET) on a substrate is disclosed, wherein the method comprises providing a substrate, forming an etch stop layer on the substrate, forming a semiconductor layer on the etch stop layer, forming a fin by removing a portion of the semiconductor layer and a portion of the etch stop layer, and converting a remaining portion of the etch stop layer and a portion of the substrate into an insulating layer.

BRIEF DESCRIPTION OF THE DRAWINGS

FIG. 3a shows a semiconductor substrate 300.

FIG. 3b shows buried etch stop layer 310 being formed within semiconductor substrate 300.

FIG. 3c shows pad layer 320 on the semiconductor substrate 300.

FIG. 3d shows finFETs 330 having been formed on insulation layer 310 after removal of a portion of semiconductor substrate 300 and a portion of pad layer 320.

FIG. 3e shows the formation of sidewall spacer 340 on the finFETs.

FIG. 3f shows the conversion of etch stop layer 310 into insulating layer 350.

FIG. 3g shows the semiconductor structure after the removal of sidewall spacer 340.

FIG. 3h shows gate dielectric 360 being provided on the finFETs.

FIG. 3i shows gate electrodes 370 being provided on gate dielectric 360.

FIG. 3j shows a top down view of the semiconductor structure along the direction of dashed double arrow 380 depicted in FIG. 3i. Further, the semiconductor structure comprises source region 390 and drain region 395.

FIG. 4a shows semiconductor substrate 400.

FIG. 4b shows etch stop layer 410 being provided on semiconductor substrate 400.

FIG. 4c shows a semiconductor layer 420 being provided on etch stop layer 410.

FIG. 4d shows pad layer 430 being provided on semiconductor layer 420.

FIG. 4e shows finFET 440 having been formed on insulation layer etch stop layer 420 after removal of a portion of semiconductor layer 430 and a portion of pad layer 430.

FIG. 4f shows the formation of sidewall spacer 450 on the finFET 440.

FIG. 4g shows the conversion of etch stop layer 410 into insulating layer 460.

FIG. 4h shows the semiconductor structure after the removal of sidewall spacer 450.

FIG. 4i shows gate dielectric 470 being provided on finFET 440.

FIG. 4j shows gate electrodes 480 being provided on gate dielectric 470.

FIG. 4k shows a top down view of the semiconductor structure along the direction of dashed double arrow 485 depicted in FIG. 4j. Further, the semiconductor structure comprises source region 490 and drain region 495.

FIG. 5a shows a semiconductor structure comprising finFET 540 with sidewall spacer 550 and pad 530 on etch stop layer 510, which, in turn, is provided on substrate 500. finFET 540 is composed of semiconductor 520 and pad 530. This semiconductor structure may be obtained through the steps performed in FIGS. 3a to 3e or FIGS. 4a to 4f.

FIG. 5b shows the removal of a portion of etch stop layer 510 by complete removal of the etch stop layer 510 between two adjacent finFETs to substrate 500.

FIG. 5c shows the conversion of the remaining portions of etch stop layer 510 and of a portion of substrate 500 into insulation region 570 having a non-planar interface with unconverted substrate 500.

FIG. 5d shows the semiconductor structure after the removal of sidewall spacer 550.

FIG. 5e shows gate dielectric 580 being provided on fin-FET 540.

FIG. 5f shows gate electrodes 590 being provided on gate dielectric 580.

DESCRIPTION OF THE BEST AND VARIOUS EMBODIMENTS

The foregoing and other objects, aspects and advantages will be better understood from the following detailed description of the best and various embodiments. Throughout the various views and illustrative embodiments of the present disclosure, like reference numbers are used to designate like elements.

It will be understood that when an element or layer is referred to as being "on" another element or layer, that the elements or layers are abutting each other. While one element or layer may be above another element or layer, "on" is not limited to an element or layer being above, but may be below or on a side to the other element or layer.

In a preferred embodiment, the fin of a finFET has a height of from about 5 nanometers to about 50 nanometers.

In another preferred embodiment, the finFET is selected from the group consisting of Si, SiGe, Ge, and GaAs. Preferably, the finFET is Si. More preferably, the Si is bulk Si.

Typically, the insulating region has a thickness of from about 5 nanometers to about 200 nanometers. Also typically, the fin has a height of from about 10 nanometers to about 50 nanometers. With particularity, the fin has a width of from about 5 nanometers to about 30 nanometers.

In a typical embodiment, the insulating region is silicon dioxide. In another typical embodiment, a bottom region of the insulating region is non-planar.

Typically, the semiconductor structure further comprises a gate dielectric on the fin and a gate conductor on the gate dielectric. Also typically, a spacer is formed on a sidewall of the fin prior to the converting the etch stop layer into an insulating layer.

With particularity, a pad layer is formed on the surface of the substrate prior to the etching the surface, and removing a portion of the pad layer during the etching the surface to form the fin and the substrate comprises performing a reactive ion etching (RIE) to form the fin. Also with particularity, the pad layer is a pad nitride or a pad oxide.

In a preferred embodiment, the spacer is a nitride spacer. Further, also in a preferred embodiment, the etch stop layer within the substrate is a buried oxide layer. In yet another preferred embodiment, the etch stop layer within the substrate is a silicon germanium layer.

In a further preferred embodiment, a pad layer is formed on the semiconductor layer prior to the forming the fin; and the pad layer is patterned.

With particularity, a sidewall spacer is formed on the fin prior to the converting the remaining portion and the portion of the substrate and the sidewall spacer is removed after the converting the remaining portion and the portion of the substrate. Also with particularity, the semiconductor layer on the etch stop layer is grown epitaxially.

Figure 1:
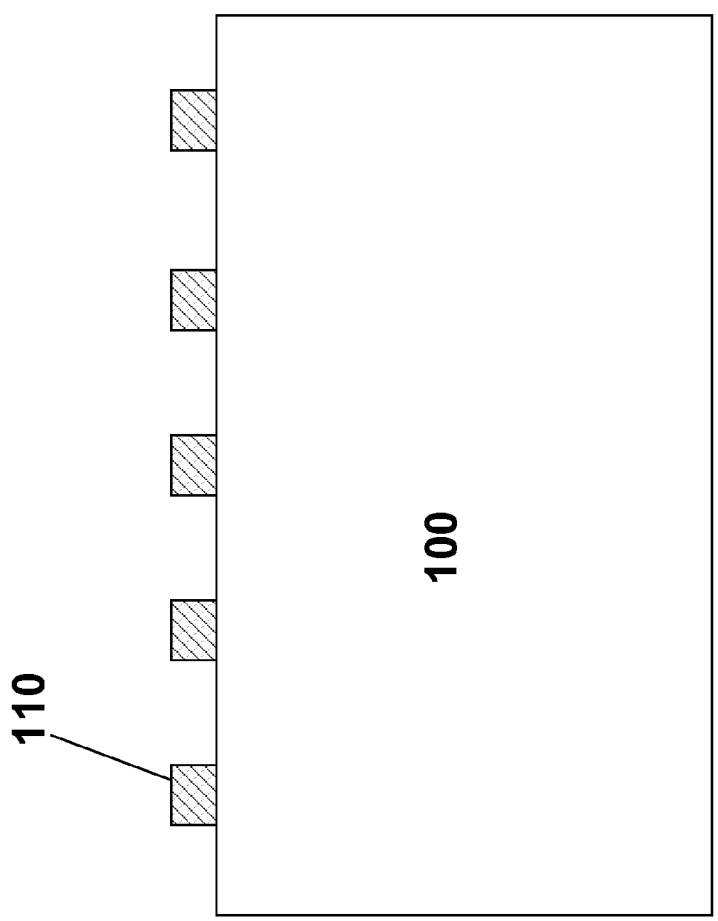
FIG. 1 shows a related art semiconductor structure of pads 110 on a semiconductor substrate 100.
Figure 2:
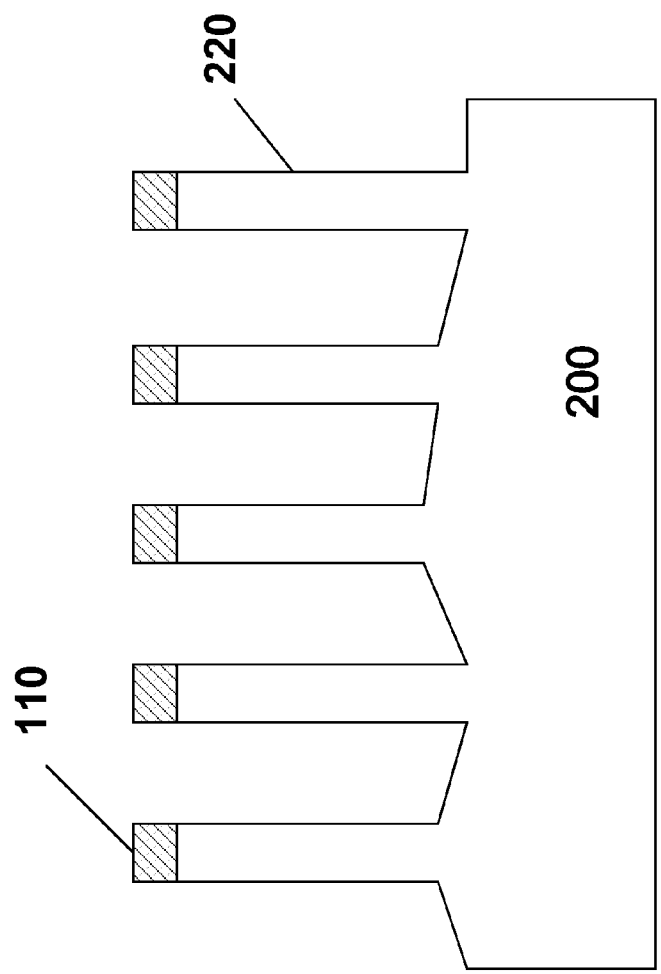
FIG. 2 shows a related art semiconductor structure of finFETs 220 on a semiconductor substrate 200.

Turning to the drawings, FIG. 1 shows a related art semiconductor structure of pads 110 on a semiconductor substrate 100. The pads are provided using a mask with subsequent etching to form the fins of FIG. 2, which shows a related art semiconductor structure of finFETs 220 on a semiconductor substrate 200. The etching process, however, results in height variations due to a non-uniform progress of the etching between fins.

Figure 3A:
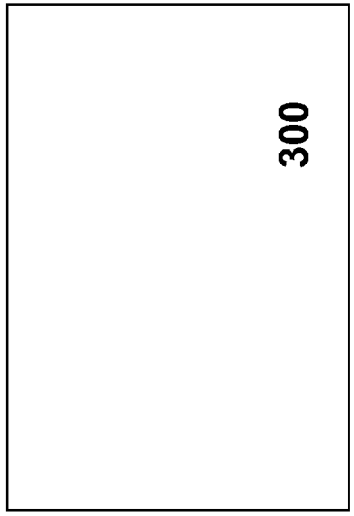
FIGS. 3a to 3j show a first method of producing a finFET semiconductor structure.
Figure 3B:
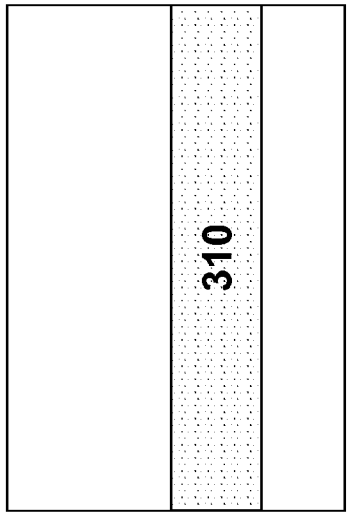

FIGS. 3a to 3j show a first method of producing a finFET semiconductor structure. Specifically, FIG. 3a shows a semiconductor substrate 300, which is provided as the starting point. At the onset, a buried etch stop layer 310 is being formed within semiconductor substrate 300. For example, a tracer, such as aluminum, arsenic, boron, gallium, indium, phosphorous, antimony, sulfur, selenium, germanium, carbon, argon, xenon, fluorine, or any suitable combination thereof is (e.g., by ion implantation) into the substrate 300 to form the etch stop layer 310. The purpose of the tracer is either to indicate an endpoint of the etching process, typically a reactive ion etching to form the find (fin RIE), or to modify the substrate properties to withstand etching to form an etch stopping layer.

Optionally, a thermal annealing process can be performed after implantation to reduce or eliminate any implantation related defects. Thus, an etch stop layer is either a layer will physically stop the etch or the tracer within the etch stop layer will provide an endpoint trace for fin RIE.

Figure 3C:
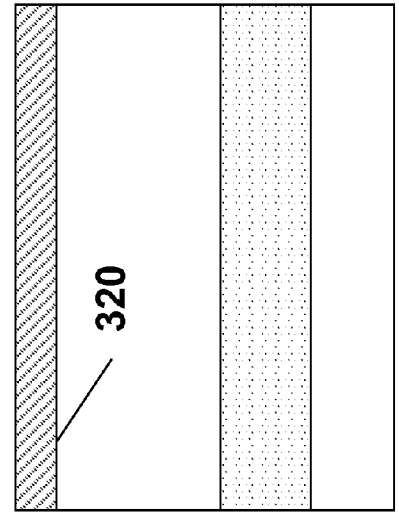

FIG. 3c shows pad layer 320 on the semiconductor substrate 300. Pad layer 320 is optional; however, the finFETs preferably contain a pad region derived from pad layer 320 in the subsequent etching step. Pad layer 320 is typically a dielectric material, such as, for example, silicon dioxide.

Figure 3D:
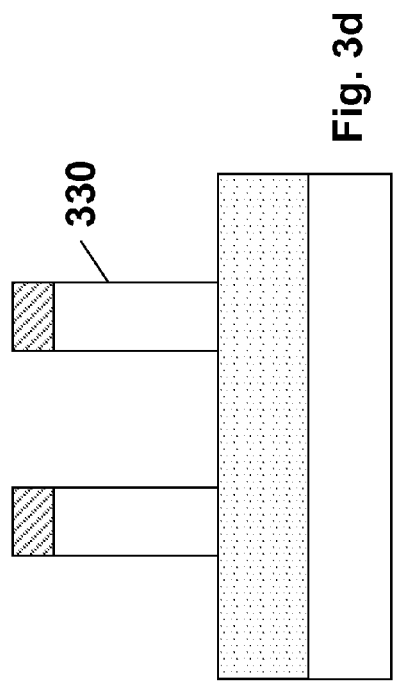

FIG. 3d shows finFETs 330 having been formed on insulation layer 310 after removal of a portion of semiconductor substrate 300 and a portion of pad layer 320 in an etching step. The etch stop layer 310 provides a defined endpoint for the etching process, which allows to prepare finFETs of uniform height if a plurality of finFETs is formed.

Figure 3E:
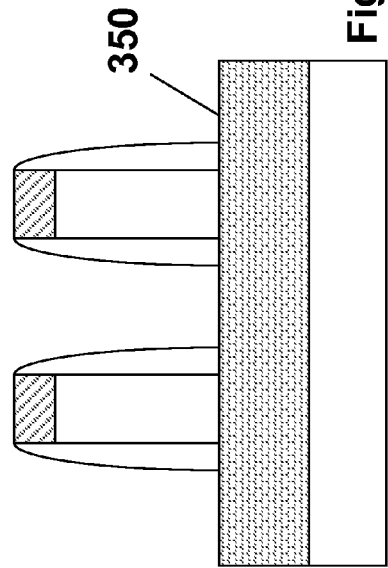
Figure 3F:
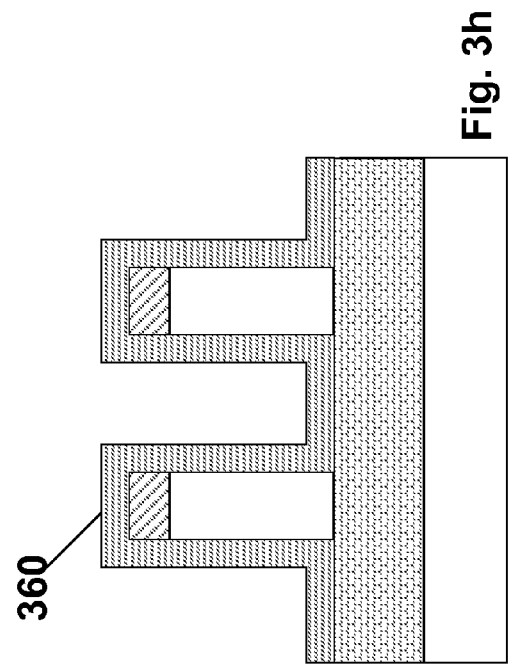

FIG. 3e shows the formation of optional sidewall spacer 340 on the finFETs. The sidewall spacer is provided only temporary to protect the fin during the subsequent conversion process to convert the etch stop layer 310 into an insulating layer 350, for example, by thermal oxidation, as shown in FIG. 3f. The insulating layer 350 allows to electrically insulate the fins from the substrate to increase the device performance.

Figure 3G:
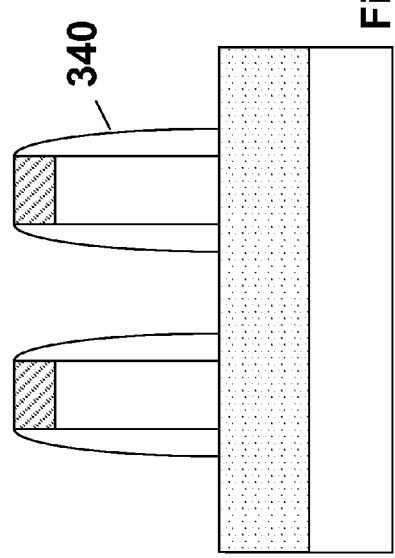
Figure 3H:
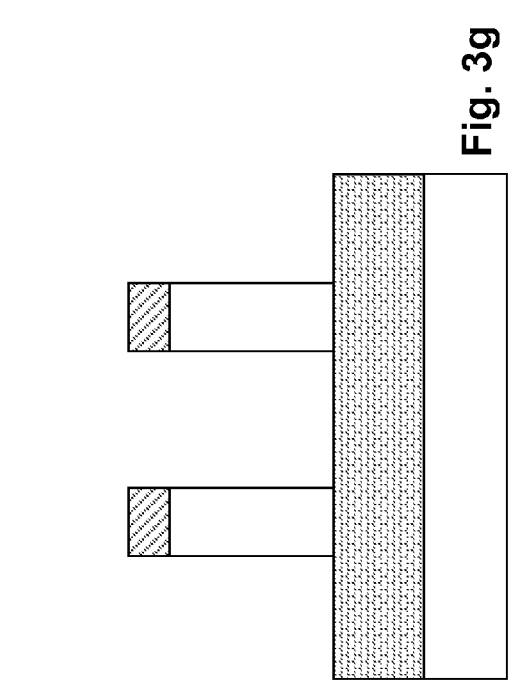

Subsequently, sidewall spacer 340 is removed, as can be seen in the resulting semiconductor structure of FIG. 3g. To arrive at the final semiconductor structure, gate dielectric 360 is being provided on the finFETs (FIG. 3h) and, thereafter, gate electrode 370 is being provided on gate dielectric 360.

Gate dielectric 360 may be selected from materials known in the art. For example, gate dielectric 360 can be chosen from SiO2, SiON, or a high k dielectric having a dielectric constant greater than 4.0, or multilayers thereof. The high k gate dielectric may further include a metal oxide or a mixed metal oxide having a dielectric constant. Some examples of high k gate dielectrics that can be used in the present disclosure include, but are not limited to: $HfO_2$, $ZrO_2$, $Al_2O_3$, $TiO_2$, $La_2O_3$, $SrTiO_3$, $LaAlO_3$, $CeO_2$, $Y_2O_3$ or multilayers thereof.

The gate dielectric can be formed by a conventional deposition process such as, for example, CVD, PECVD, ALD, metalorganic chemical vapor deposition (MOCVD), evaporation, reactive sputtering, chemical solution deposition or other like deposition processes. Alternatively, the gate dielectric can be formed by a thermal process. The physical thickness of the gate dielectric may vary, but typically, the gate dielectric has a thickness from about 0.7 to about 100 nm, with a thickness from about 1 to about 7 nm being even more typical.

After forming gate dielectric 360, the gate electrode 370 is formed utilizing a conventional deposition process including, for example, CVD, PECVD, ALD, MOCVD, chemical solution deposition, reactive sputtering, platting, evaporation or other like deposition processes. The gate electrode 370 may be any suitable conductive material, such as, for example, doped polySi, doped SiGe, a conductive elemental metal, an alloy of a conductive elemental metal, a nitride or silicide of a conductive elemental metal or multilayers thereof.

Figures 3I, 3J:
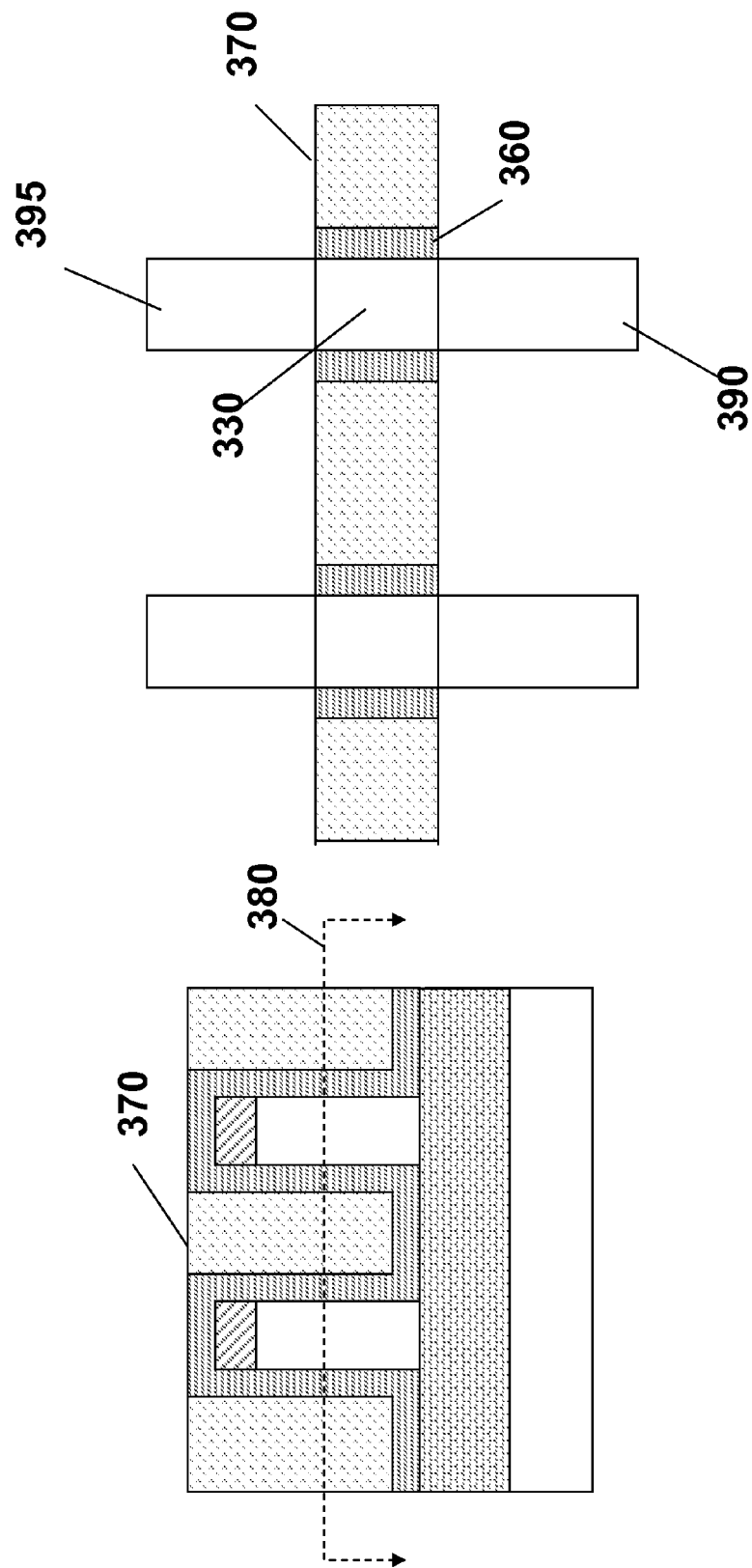

FIG. 3j shows a top down view of the semiconductor structure along the direction of dashed double arrow 380 depicted in FIG. 3i. Further, the semiconductor structure comprises source region 390 and drain region 395.

FIGS. 4a to 4k show an alternative method of producing a finFET semiconductor structure. Specifically, semiconductor substrate 400 is provided as a starting point for forming a finFET semiconductor structure.

Initially, etch stop layer 410 is being provided on semiconductor substrate 400. Subsequently, a semiconductor layer 420 being provided on etch stop layer 410. Accordingly, semiconductor substrate 400 and semiconductor layer 420 may be from the same material, but may also be different. Afterwards, pad layer 430 is being provided on semiconductor layer 420. In contrast to the method described above, this method allows to form an etch stop layer by epitaxial growth.

Thereafter, finFET 440 is formed on insulation layer etch stop layer 420 after removal of a portion of semiconductor layer 430 and a portion of pad layer 430 by etching. This method also allows for the etching process to continue until a defined end point has been reached, thereby assuring that the finFETs have uniform height.

Figure 4A:
FIGS. 4a to 4k show a second method of producing a finFET semiconductor structure.
Figure 4B:
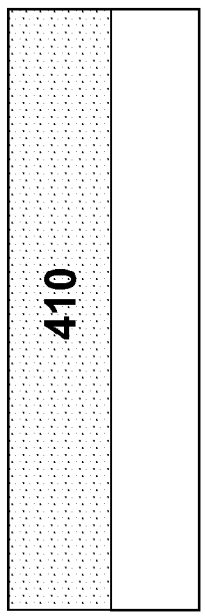
Figure 4C:
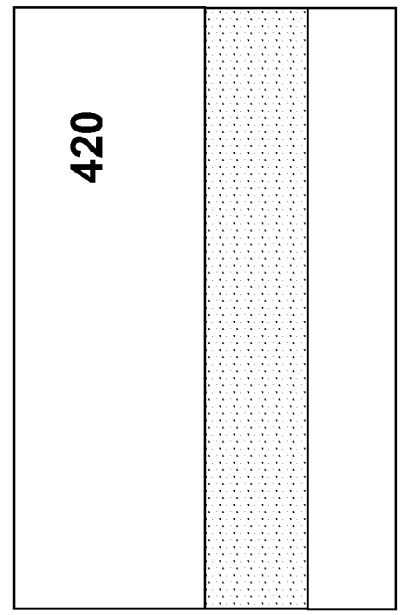
Figure 4D:
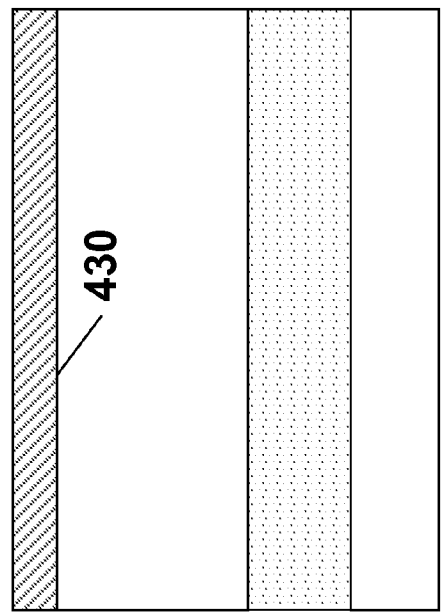
Figure 4E:
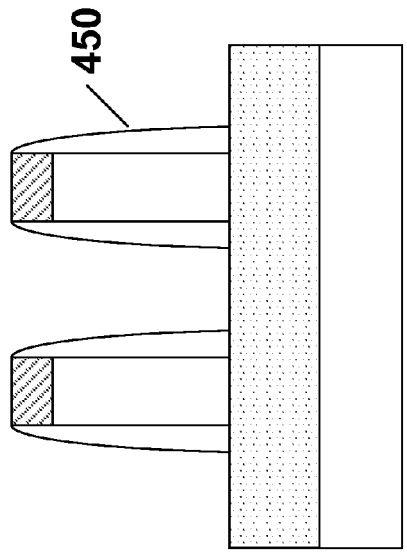
Figure 4F:
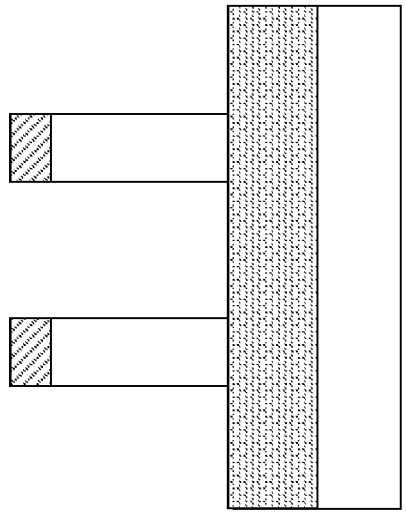
Figure 4G:
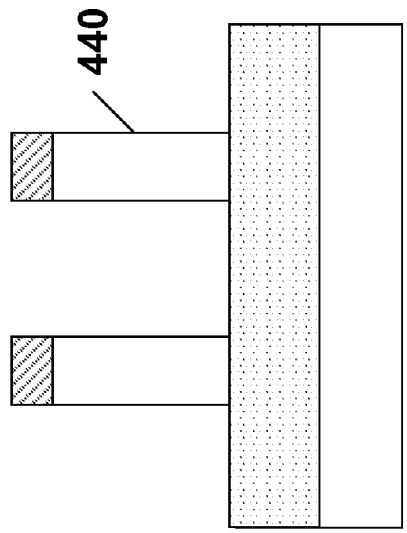
Figure 4H:
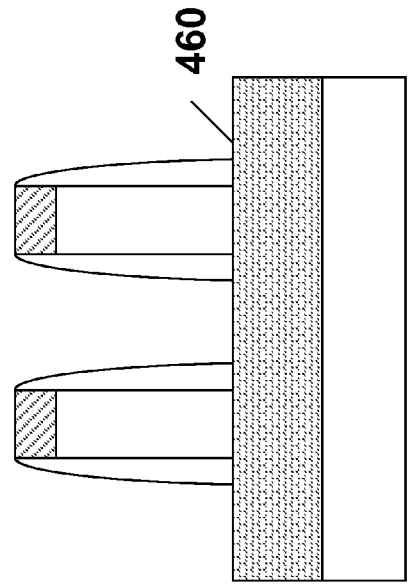
Figure 4I:
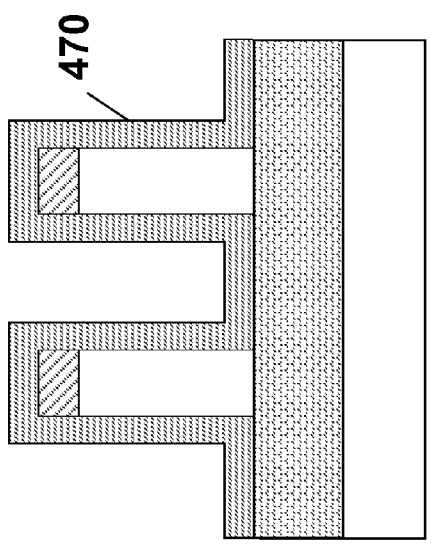

FIG. 4f shows the formation of sidewall spacer 450 on the finFET 440. In a subsequent conversion step, etch stop layer 410 is converted into insulating layer 460. The presence of the sidewall spacers and the spatial distance of the fins from the resulting insulating layer avoids diffusion of impurities into the fins and, therefore, increases device performance. After the conversion, sidewall spacer 450 is removed.

To finish the final semiconductor structure, gate dielectric 470 is provided on finFET 440, and, thereafter, gate electrodes 480 is provided on gate dielectric 470.

Figure 4J:
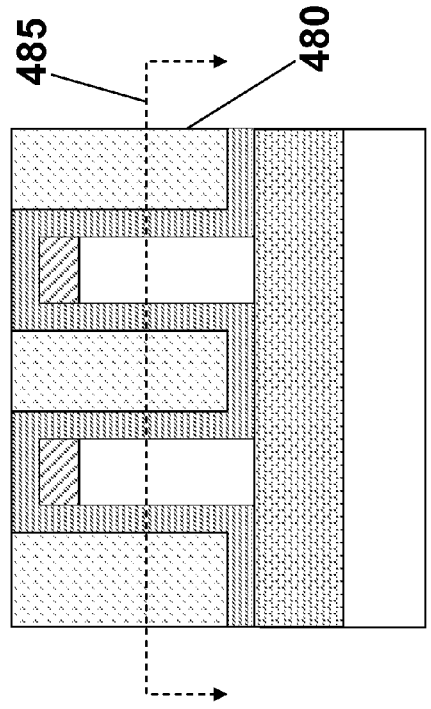
Figure 4K:
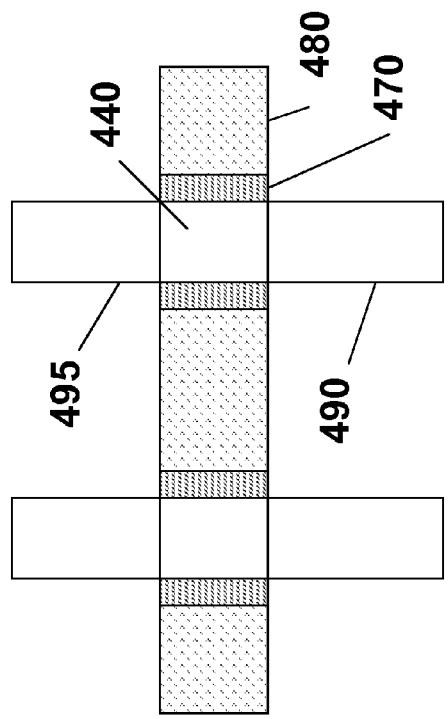
Figure 5A:
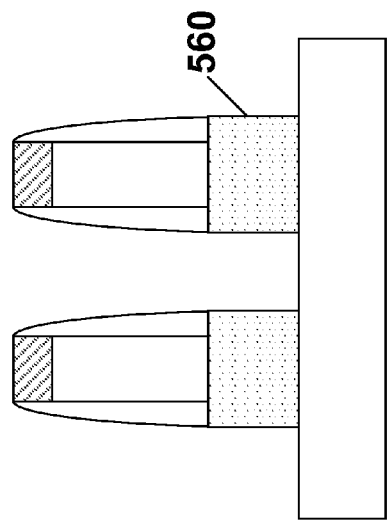
FIGS. 5a to 5f show a third method of producing a finFET semiconductor structure.
Figure 5B:
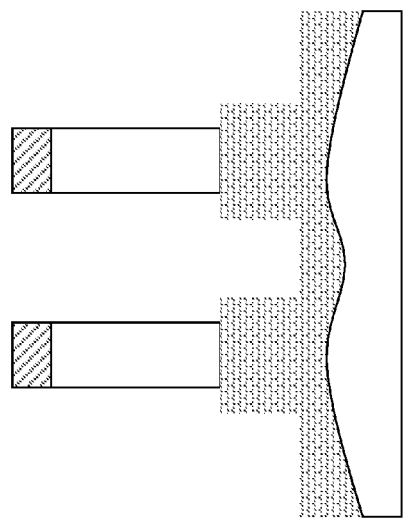
Figure 5C:
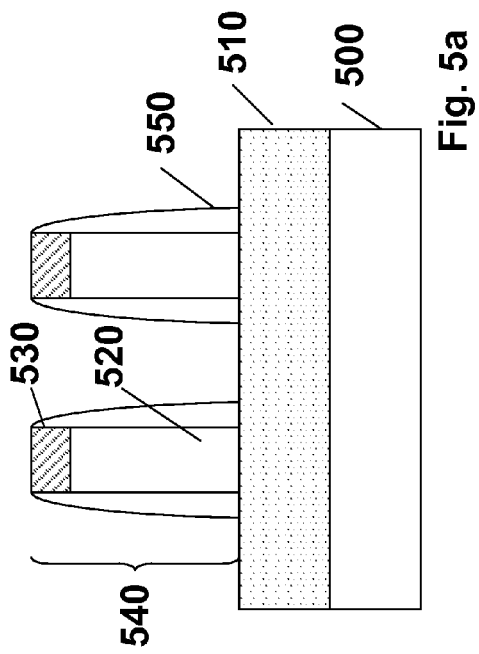
Figure 5D:
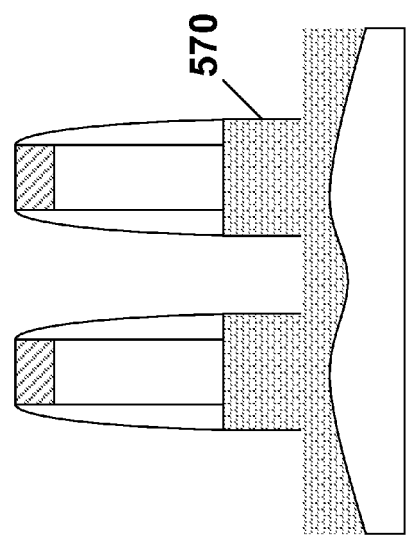
Figure 5F:
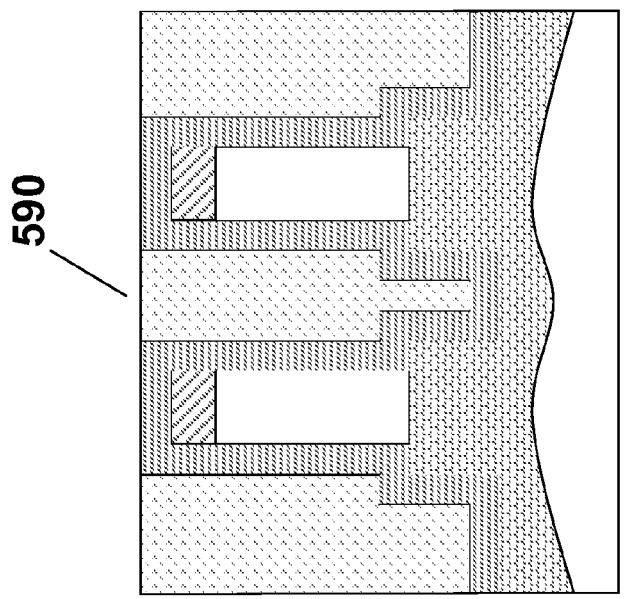
Figure 5E:
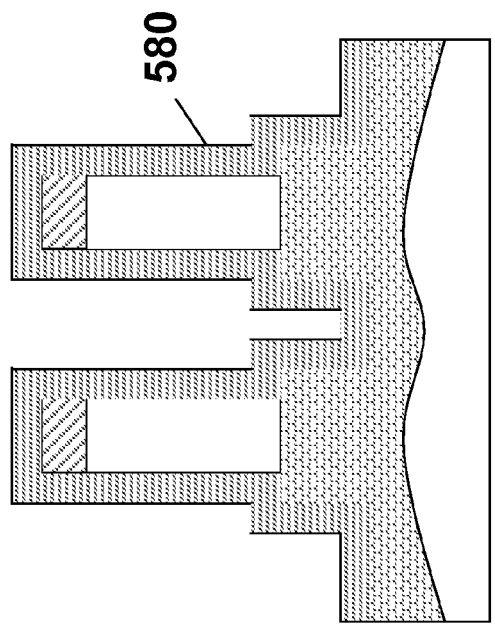

FIG. 4k shows a top down view of the semiconductor structure along the direction of dashed double arrow 485 depicted in FIG. 4j. Further, the semiconductor structure comprises source region 490 and drain region 495.

In FIGS. 5a to 5f a third method of producing a finFET semiconductor structure is shown. The starting point is a semiconductor structure comprising finFET 540 with sidewall spacer 550 and pad 530 on etch stop layer 510, which, in turn, is provided on substrate 500. finFET 540 is composed of semiconductor 520 and pad 530. This semiconductor structure may be obtained through the steps performed in FIGS. 3a to 3e or FIGS. 4a to 4f.

In this case, the removal of a portion of etch stop layer 510 between two adjacent finFETs on substrate 500 is complete, which results in fins having a bottom portion being made from a different material than the semiconducting channel region in the center of the fin.

Thereafter, a conversion of the remaining portions of etch stop layer 510 and of a portion of substrate 500 into insulation region 570 occurs, which results in a non-planar interface of insulation region 570 and unconverted substrate 500.

Sidewall spacer 550 is not needed in the final structure and removed prior to the provision of gate dielectric 580 being on finFET 540, and, subsequently, gate electrodes 590 on gate dielectric 580.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

What is claimed is:

1. A method of forming a fin Field Effect Transistors (finFET) comprising a plurality of fins of uniform height on a bulk semiconductor substrate wherein the plurality of fins are isolated from the bulk semiconductor substrate, the method comprising:
   providing the bulk semiconductor substrate;
   forming an etch stop layer within the bulk semiconductor substrate;
   etching a surface of the bulk semiconductor substrate up to or into the etch stop layer to form the plurality of fins of uniform height;
   converting the etch stop layer into an insulating layer;
   forming a spacer on a sidewall of the plurality of fins prior to the converting the etch stop layer into the insulating layer;
   forming a pad layer on the surface of the bulk semiconductor substrate prior to the etching the surface; and
   removing a portion of the pad layer during the etching the surface to form the plurality of fins and the bulk semiconductor substrate comprises performing a reactive ion etching (RIE) to form the plurality of fins.

2. The method of claim 1, wherein the plurality of fins has a height of from about 5 nanometers to about 50 nanometers.

3. The method of claim 1, wherein the bulk semiconductor substrate is selected from the group consisting of Si, SiGe, Ge, and GaAs.

4. The method of claim 3, wherein the bulk semiconductor substrate is Si.

5. The method of claim 4, wherein the Si is bulk Si.

6. The method of claim 1, wherein the insulating layer has a thickness of from about 5 nanometers to about 200 nanometers.

7. The method of claim 1, wherein the fin has a height of from about 10 nanometers to about 50 nanometers.

8. The method of claim 1, wherein the fin has a width of from about 5 nanometers to about 30 nanometers.

9. The method of claim 1, wherein the insulating layer is silicon dioxide.

10. The method of claim 1, wherein a bottom layer of the insulating layer is non-planar.

11. The method of claim 1, further comprising providing a gate dielectric on the plurality of fins and providing a gate conductor on the gate dielectric.

12. The method of claim 1, wherein the pad layer is a pad nitride or a pad oxide.

13. The method of claim 1, wherein the spacer is a nitride spacer.

14. The method of claim 1, wherein the etch stop layer within the bulk semiconductor substrate is a buried oxide layer.

15. The method of claim 1, wherein the etch stop layer within the bulk semiconductor substrate is a silicon germanium layer.

16. The method of claim 1, wherein the insulating layer comprises a dopant selected from the group consisting of aluminum, arsenic, boron, gallium, indium, phosphorous, antimony, sulfur, selenium, fluorine, carbon, germanium, argon, and xenon, or a combination thereof.

* * * * *